United States Patent [19]

Hall

[11] Patent Number: 5,167,748
[45] Date of Patent: Dec. 1, 1992

[54] PLASMA ETCHING METHOD AND APPARATUS

[75] Inventor: Bernard J. Hall, San Francisco, Calif.

[73] Assignee: Charles Evans and Associates, Redwood City, Calif.

[21] Appl. No.: 579,331

[22] Filed: Sep. 6, 1990

[51] Int. Cl.⁵ .............................................. H01L 21/00
[52] U.S. Cl. .................................... 156/345; 156/627; 156/643; 118/723; 427/8
[58] Field of Search ................ 156/626, 627, 345, 643; 118/723; 427/8

[56] References Cited

U.S. PATENT DOCUMENTS

| | | | |
|---|---|---|---|
| 4,207,137 | 6/1980 | Tretola | 156/627 |
| 4,316,791 | 2/1982 | Taillet | 156/345 |
| 4,767,496 | 8/1988 | Hieber | 156/627 |

FOREIGN PATENT DOCUMENTS

57-023226 2/1982 Japan.
58-079722 5/1983 Japan.
63-069987 3/1988 Japan.

OTHER PUBLICATIONS

"Plasma Etching In Semiconductor Fabrication"; by Russ A. Morgan; Elsevier; ©1985.
N. Kelly, U. Kaiser, *Research & Development*, Aug. 1987, pp. 58-61, "SNMS Produces SIMS Quality Without Matrix Effects".
A. Wucher, F. Novak, W. Reuter, *J. Vac. Sci. Technol.*, vol. 6, No. 4, Jul./Aug. 1988, pp. 2265-2270, entitled "Relative Elemental Sensitivity Factors in Secondary Neutral Mass Spectrometry".
A. Wucher, *J. Vac. Sci. Technol.*, vol. 6, No. 4, Jul./Aug. 1988, pp. 2293-2298, entitled "Plasma Studies on the Leybold-Heraeus INA3 Secondary Neutral Mass Spectrometry System".
Dr. I. Langmuir and H. Mott-Smith, Jr., *General Electric Review*, 1924, vol. 17, No. 7, pp. 449-455, entitled "Studies of Electric Discharges in Gases at Low Pressures, Part I".
Dr. I. Langmuir and H. Mott-Smith, Jr., *General Electric Review*, Aug. 1924, vol. 27, No. 8, pp. 538-548, entitled "Studies of Electric Discharges in Gases at Low Pressures, Part II".

*Primary Examiner*—Brian E. Hearn
*Assistant Examiner*—George Goudreau
*Attorney, Agent, or Firm*—Limbach & Limbach

[57] ABSTRACT

Method and apparatus for monitoring and maintaining the geometry of plasma in a plasma chamber is disclosed wherein the plasma density and plasma temperature in the chamber are monitored to calculate an initial sample dc voltage which is applied to the sample or first probe in or adjacent to the temperature. The current to the sample or first probe is then measured, a new sample voltage for the sample or first probe is then calculated and applied and these latter steps of measuring, calculating and applying are repeated. Different wire and flat probe structures and positions are disclosed.

16 Claims, 5 Drawing Sheets

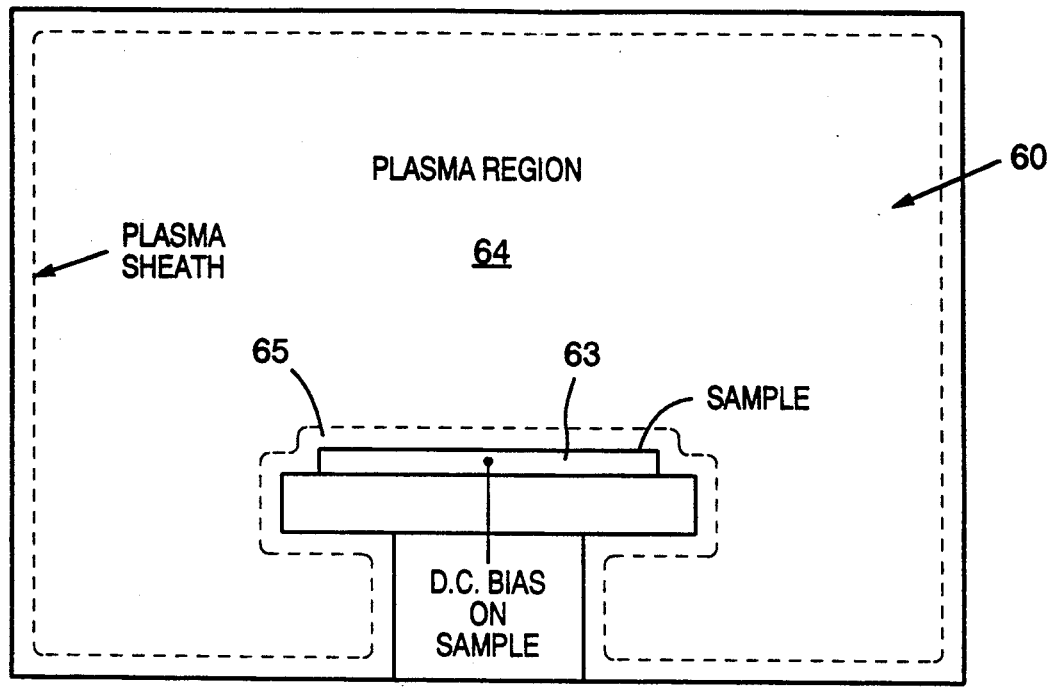
FIG. 5
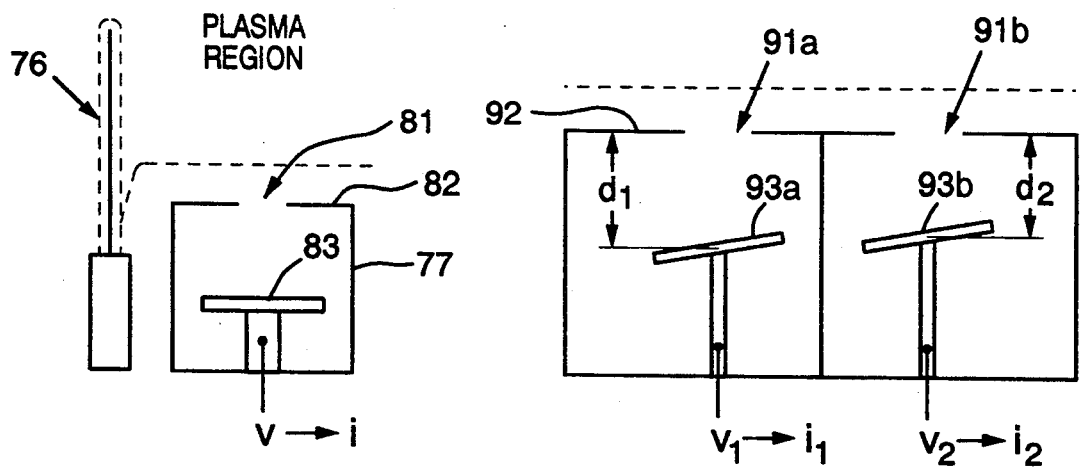
FIG. 6  FIG. 7

PLASMA ETCHING METHOD AND APPARATUS

This invention was made with Government support under Army Contract No. DAAH01-87C-1197. The Government has certain rights in this invention.

The present invention relates in general to plasma etching and more particularly to secondary neutrals mass spectrometer method and apparatus.

BACKGROUND

The etching of surfaces by ion bombardment from DC or RF plasmas is a widely used technique. The purpose of the technique can range from cleaning applications, where a few atom layers are removed from the target surface, to applications where many micrometers are removed to obtain a desired etch. In conjunction with this process it is also possible, and in fact is done, to analyze the elements being removed from the surface using a mass spectrometer to obtain a depth profile. Initially, it was from this particular application that the present invention was developed.

A plasma etching and analyzing device for performing the processes mentioned above has been made and sold by Leybold-Heraeus Vacuum Products Inc. and designated the INA3 Secondary Neutrals Mass Spectrometer (SNMS). The construction and general operation of the INA3 system are described by N. Kelly and U. Kaiser in "SNMS Produces SIMS Quality Without Matrix Effects", *Research & Development*, August 1987, pages 58-61, Cahners Publishing Company. Use and results of use of the INA3 device are described in the literature such as by A. Wucher et al in "Relative Elemental Sensitivity Factors in Secondary Neural Mass Spectrometry", J. Vac. Sci. Technol. A, Vol.6, No. 4, July/August 1988, pages 2265-2270 and in other articles in that same issue. The INA3 SNMS device employs an RF coupled plasma developed in a low pressure Ar gas environment. A sample is placed behind an aperture into the plasma chamber. By placing an appropriate negative bias voltage onto the sample, Ar ions are drawn from the plasma onto the sample surface, and neutral atoms are ejected from the sample surface, postionized in the plasma and then analyzed by a quadropole mass spectrometer.

The measurement with SNMS requires that the fluence of sputtering ions be very uniform across a large area of the sample surface (about 20 mm$^2$), and the capability for lateral uniform sputtering over such a large area, combined with reasonable detection limits has been demonstrated for the INA3 instrument. The problem arises in achieving this capability on a daily basis, as required for routine applications. Variations in instrument parameters, including sample positioning and evolution of plasma conditions, all influence the lateral uniformity of the bombarding ions, making routine and systematic application of the technique difficult.

SUMMARY OF THE INVENTION

The present invention is directed to method and apparatus for monitoring and maintaining the geometry of plasma in a plasma chamber by calculating an initial voltage to be applied to a probe or sample for then measuring the probe or sample current resulting from the applied calculated voltage to calculate the current density and a new sample or probe voltage which is then applied to the sample or probe and repeating the steps for calculating and applying a new corrected voltage to the sample or probe.

Another aspect of the present invention is performing analysis with SNMS instruments wherein the process is conducted in a way to maintain the shape of the plasma across the aperture uniform.

In accordance with one aspect of the present invention, the plasma density and temperature are monitored to calculate a sample voltage which is applied to the sample and the current to the sample is then measured to calculate a new sample voltage which is applied to the sample for repeating the steps of calculating and applying a new corrected voltage to the sample.

In accordance with one aspect of the present invention, the plasma temperature and plasma density are determined by a probe positioned in the chamber outside the aperture.

In accordance with another aspect of the present invention, a pair of probes are utilized to measure the plasma density and plasma temperature in the chamber and then providing a first calculated voltage to a sample or probe which is changed in accordance with the sample current to the sample or probe and the current density from the voltage applied so as to provide a new sample voltage which procedure is repeatedly performed successively to provide new sample voltages.

In accordance with one aspect of the last aforementioned feature, the pair of probes includes one standard wire langmuir probe and a second probe that comprises a flat probe located behind an aperture in the wall of an aperture assembly within the plasma chamber.

In accordance with still another aspect of the present invention, the pair of probes in the next last aforementioned aspect of the invention comprise a pair of flat probes each of which is positioned behind a aperture in a wall of a aperture assembly located in the plasma chamber.

In accordance with another aspect of the present invention, the pair of probes as set forth in the next preceding paragraph are positioned at different distances from the apertures and have different voltages applied thereto.

In accordance with still another aspect of the present invention as set forth in the next preceding paragraph, the plasma probes are positioned at an angle with the apertured wall to reduce the number of scattered particles entering the plasma.

These features and advantages of the present invention will become more apparent upon a perusal of the following specification taken in conjunction with the accompanying drawings wherein similar characters of reference represent similar parts in each of the several views.

DESCRIPTION OF THE DRAWINGS

FIG. 5 illustrates a typical sputtering chamber employing this invention.

FIG. 6 illustrates a standard wire probe and a flat probe working together.

FIGS. 7 and 8 illustrate two flat probes operating together.

DESCRIPTION OF THE PREFERRED EMBODIMENT

Figure 1:
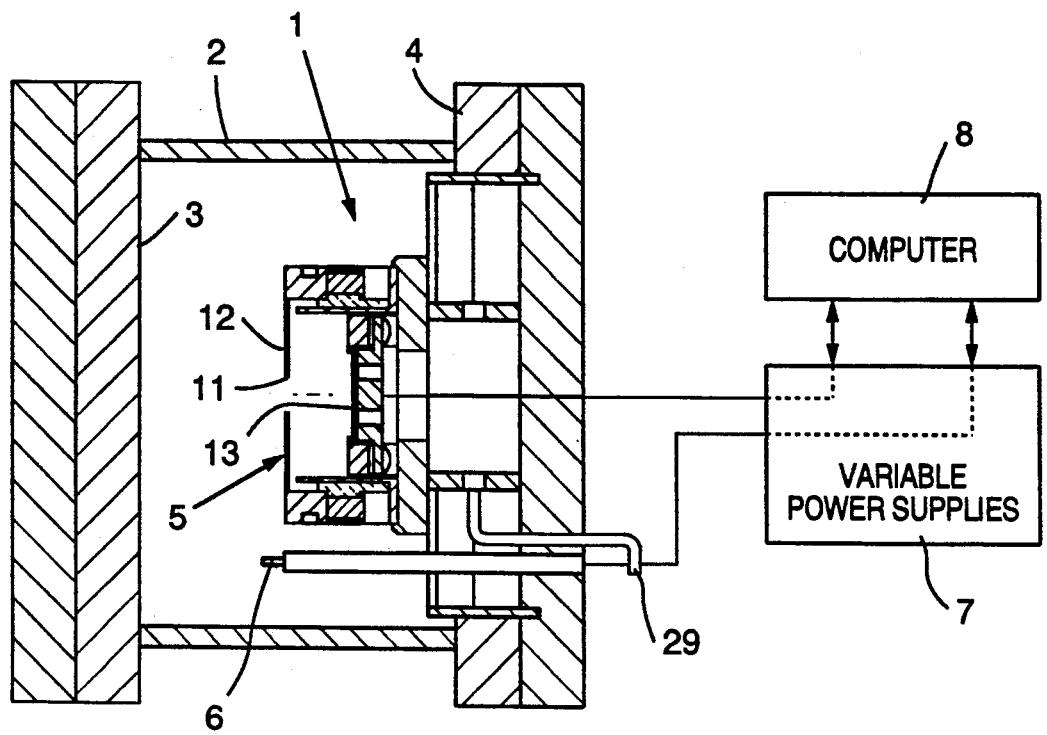
FIG. 1 illustrates one operative embodiment of the present invention.

With particular reference to FIG. 1, there is shown a SNMS plasma chamber 1 having side walls 2 and end walls 3 and 4, and an aperture assembly 5 having a wall 12 with an aperture 11 behind which a sample 13 is supported from a sample support structure. A langmuir probe 6 is positioned in the plasma chamber 1 outside the aperture assembly 5 to monitor the plasma temperature $T_p$ and plasma density n. Variable power supplies 7 are provided capable of being stepped from large negative to positive voltages (and output currents as high as 0.5 amps) to apply to the sample 13 and probe 6. A computer 8 connected to the power supplies 7 can step the voltage onto the probe 6 and sample 13 and also read the current drawn as well as digitize the stepped voltage and current draw to find the plasma temperature $T_p$ and plasma density n.

Figure 2:
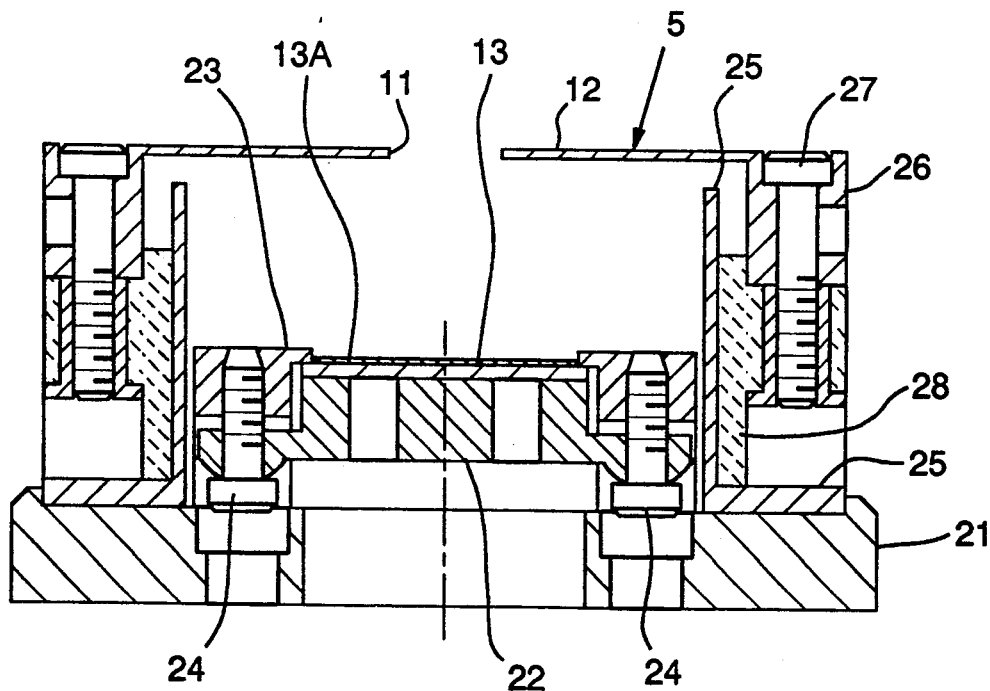
FIG. 2 is an enlarged sectional view of the sample holder and aperture assembly shown in FIG. 1.

The sample support structure which is illustrated in FIG. 2 includes a sample holder base 21, such as of copper, having a central sample retainer 22 on which the sample 13 is held by sample block mounts 23, such as of tantalum, overlapping the sample 13 and a front sample mask 13A. The sample mounts 23 are held to the sample retainer 22 via plurality of stainless steel screws 24. An RF shield 25, such as of stainless steel, is supported on the sample base 21 and projects toward the apertured wall 12 around the sample 13. The apertured wall 12 of the aperture assembly 5 is insulatively supported via mounts 26 and screws 27 connected to an insulator 28, such as of MACOR supported on the outside of the shield 25.

Since the sample is used as a plasma probe as described in greater detail below, the sample support prevents sputtered material from being deposited on the insulator to prevent sample-to-ground shorting and good thermal insulation of the sample from the aperture assembly 5. The sample mount is sealed preventing gas (ion) flow into the region behind the RF shield 25, and no gas is introduced into this region which is pumped at 29 via a vacuum pump (not shown) to eliminate any possibility of maintaining a plasma.

Figure 3A:
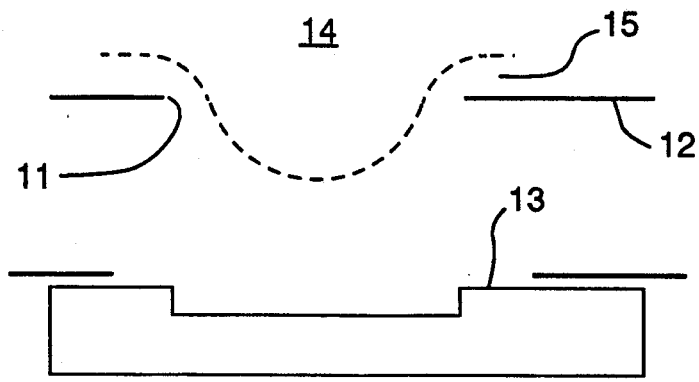
FIGS. 3A, 3B and 3C illustrate variation in the shape of the plasma at the aperture due to various processing conditions.
Figure 3B:
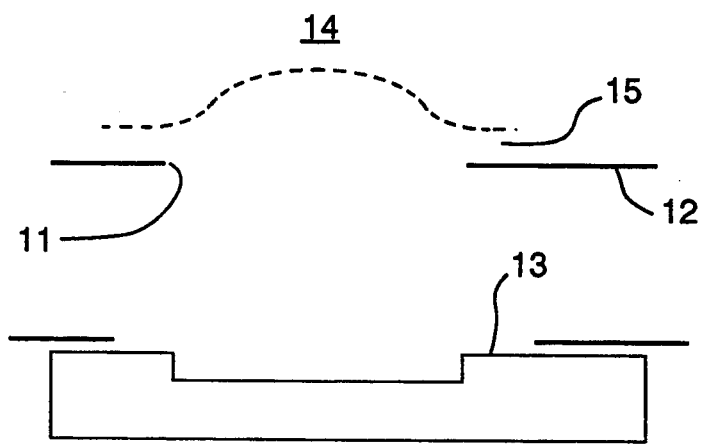
Figure 3C:
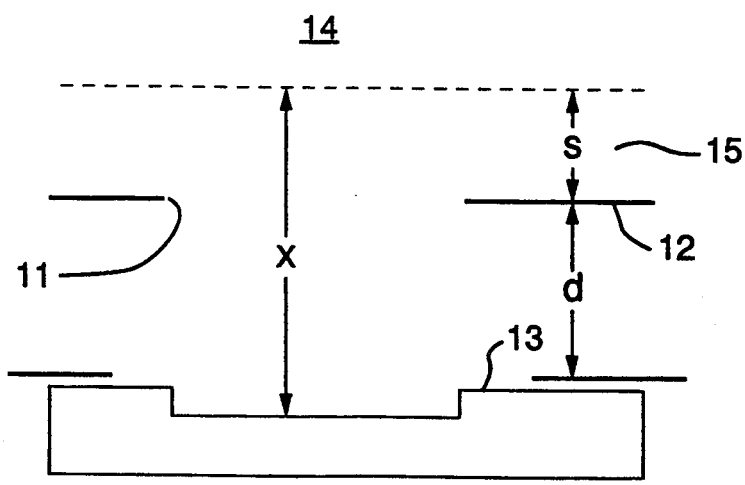

FIGS. 3A, 3B and 3C illustrate the plasma 10 relative to the aperture 11 in the chamber wall 12 and the sample 13 which is set back, outside the plasma chamber at a given distance d. Plasmas can in general be divided into two separate regions 14 and 15 as shown in FIGS. 3A, 3B and 3C of the drawing. A central region 14 encompasses all but a small dark space region 15 or langmuir sheath which separates the chamber wall from the plasma and in which a small fraction of the gas atoms are ionized. This langmuir sheath 15 is a high field region where plasma ions and electrons from the chamber wall are exchanged. In general this sheath 15 is a very uniform layer with the distance between the wall 12 and the edge between regions 14 and 15 being determined by plasma conditions (e.g. plasma temperature $T_p$ and density n). When an opening 11 is made through the chamber wall 12 the plasma will move through this opening and set up a sheath 15 along a new boundary as shown in FIG. 3A.

The purpose of the INA3 is to achieve very uniform sputtering of surfaces of a sample. To achieve this the ions extracted from the plasma 10 must strike perpendicular to the surface of the sample 13. The sheath edge above the sample surface must be uniform and not bowed either in or out relative to the sample. A plasma sheath edge bowing into the aperture 11 as shown in FIG. 3A is remedied by placing a negative bias onto the sample. This causes the edge of the langmuir sheath 15 to move away from the sample. The resulting plasma sheath may bow outwardly as shown in FIG. 3B, but at a precise and unique voltage (for a given set of relevant parameters to be described below) the sheath will be perfectly uniform above the sample as shown in FIG. 3C. With this precise voltage applied the desired result of uniform sputtering will occur.

Using the theory of space charge limited flow he had developed earlier, Irving Langmuir arrived at the following equation relating plasma parameters and the sheath distance for a flat conducting surface, with dc voltage applied to it:

$$n e(K T_e/2\pi m)^{\frac{1}{2}} = 2.336 \times 10^{-6} V^{3/2}(1+0.0247\sqrt{T_p/V})/x^2 \sqrt{m/m_e} \quad (1)$$

where n is the plasma density, $T_e$ is electron temperature, $T_p$ the plasma temperature, V the dc voltage difference between the sample and the plasma, m and $m_e$ the ion and electron masses, x the sheath distance and K the Boltzman constant. I. Langmuir and H. Mott-Smith Jr., G.E. Rev. 17 (7), 449 and 538 (1924).

Thus by measuring the plasma parameters with a standard langmuir probe to obtain T and n and by knowing V, x can be calculated. Problems do, however, arise. The measurement of n by this technique is not reliable to better than 5% without great difficulty, plasma densities vary throughout the plasma thus the value measured by the probe will differ from that near the sample surface; the operation of the probe itself disturbs the plasma and thus will give slightly erroneous results; and the conditions of the plasma typically vary over time.

Because of these problems the use of a standard langmuir probe as the only method of obtaining n and T for the above calculation is not acceptable. Further to this, even if reliable results could be obtained from the standard probe, the fact that it disturbs the plasma excludes its use during runtime of the instrument. This would not allow for the constant monitoring of possible changes in plasma conditions during runtime.

A more accurate method for monitoring n while at the same time not disturbing the plasma is achieved with the present invention. In equation (1) above the left hand side of the equation is the ion current density in the plasma. This value can be obtained by measuring the current on a flat probe. The current density I in the plasma is extracted using the following equations also developed by Langmuir:

$$\sqrt{i} = S\sqrt{m} + b$$

$$m = V^{3/2}(1+0.0247\sqrt{T/V}) \quad (2)$$

where i is the current to the probe.

Figure 4:
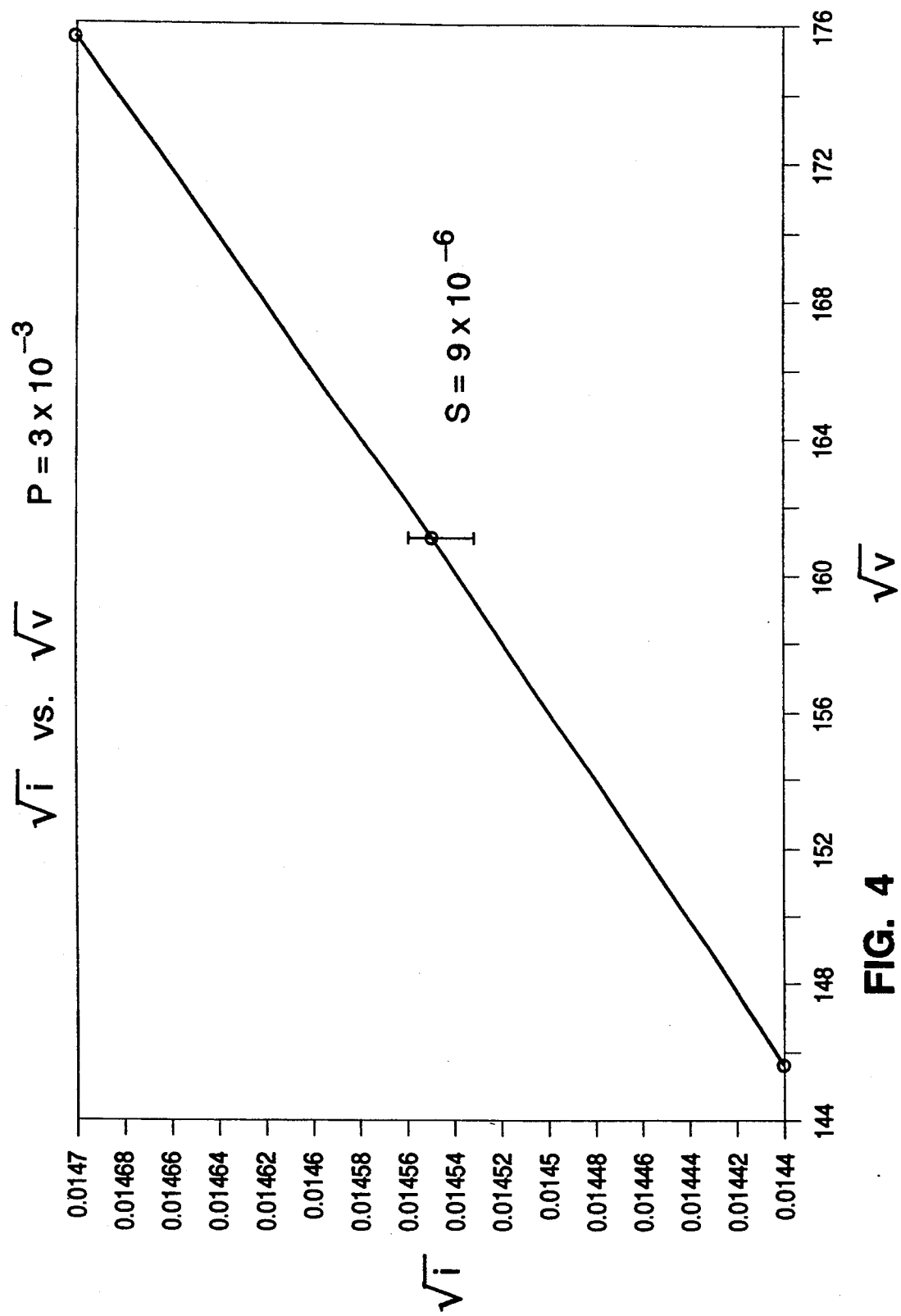
FIG. 4 is a plot of voltage versus drawn current for a sample in an aperture assembly for determining the constant S.

S is a constant of the system, is independent of plasma conditions and probe area, and can easily be measured by varying the voltage on a test sample and measuring the resulting current. A plot of i vs V, such as shown in FIG. 4, will provide a value for S. As mentioned, this value is constant and need only be measured once.

The current density can be determined from $b^2$/(probe area) since:

$$\frac{b^2}{\text{(flat probe area)}} = I = ne(KT/2\pi m)^{\frac{1}{2}}$$

The resulting value of b gives a more accurate value for n than determined from the langmuir probe.

Equation (1) can be modified for probes, such as sample 13, that sit outside the plasma volume by changing V to (V+U) (where V is now the applied voltage and U is the plasma potential relative to ground) and x to (d+s) (where d is the probe to aperture distance and s is the aperture to sheath edge distance as shown in FIG. 3C).

Modified equation (1) becomes:

$$ne(KT_e/2\pi m)^{\frac{1}{2}} = 2.336 \times 10^{-6}(-V+U)^{3/2}(1+0.0247\sqrt{Tp/(V+U)})/(d+s)^2\sqrt{m/m_e} \quad (1a)$$

In accordance with the present invention, n the INA3 the sample acting as a probe gives a very sensitive reading of the plasma density precisely in the region of interest.

Then the procedural steps for obtaining and applying the precise bias voltage needed for uniform sputtering in the INA3 and any other similar system are the following:

a) Plasma is monitored using a thin wire langmuir probe to measure n and T.
b) Approximate voltage V is calculated using equation (1) above.
c) This calculated voltage from step b) is applied to the sample.
d) The current to the sample is measured.
e) The current density is calculated from equation (2) using the current measured in step d).
f) The voltage V is recalculated from equation (1a) with the left hand side of the equation (1a) being replaced with the current density calculated in step e) and the value of T measured in step a) also being used.
g) This new value of V is applied to the sample.
h) Return to step d) and continuously loop through steps d) to g).

The computer 8 incorporates software capable of analyzing the stored current versus voltage data and analyzing the flat probe equations, based on the collected data, as given above.

The procedure of looping through steps d) to g) encompasses the aforementioned real-time feedback of the process.

It must be noted that the plasma temperature and density can be measured in any number of other ways and used as a replacement for the thin wire method used in step a).

The process and apparatus of the above described preferred embodiment of this invention has been used successfully on the Leybold-Heraeus INA3 but is not limited to that system. In any plasma etch or ion mill system where ions from a plasma bombard a work piece, such as a sample surface, the ion current to the sample can be measured and used as a monitor of plasma conditions and/or as link in the process described above. Instead of measuring ion current to the sample itself, a conductor placed flush next to the work piece or recessed in the work piece platform can act as a probe.

In this way uniform etch rates can be insured by keeping the plasma to work piece distance constant. In a system where the work piece 63 sits directly in the plasma 60 as shown in FIG. 5, the sheath distance to the edge between the central region 64 and langmuir sheath 65 can be kept constant by varying the power input as part of a feedback loop as described above to maintain a dc bias on the sample.

Even in systems where no etching is being done but knowledge of plasma conditions is desired, plasma probe/control setups similar to those described above can be implemented.

As shown in FIG. 6, a standard thin wire probe 76 is located in the plasma chamber 71 adjacent to a cylinder 77 containing a flat probe 83 at an appropriate bias voltage (determined as given in the process above) capped with a wall 82 having an aperture 81. The two probes working in concert allow for accurate monitoring of plasma density (assuming T does not vary appreciably) with minimal disturbance to the plasma. The advantage of the cylinder design over that of a flat probe is that equation (2) is more accurately applied.

To eliminate the need for a standard langmuir probe two flat probes 93a and 93b as illustrated in FIG. 7 can be operated together. By selecting different values for d and V for the two, and after appropriate calibration, equation (2) can be applied for both probes 93a and 93b and by solving the two simultaneously, both n and T can be found. The advantage here is that the plasma conditions can be continuously monitored with minimal disturbance to the plasma. By selecting appropriate values for $V_1$ and $V_2$, as indicated in FIG. 7, so as to keep the plasma sheath fairly uniform and by tilting each of the probes 93a and 93b, as seen in FIG. 7, to reduce the number of sputtered particles entering the plasma from the probes 93a and 93b, this minimal disturbance to the plasma is achieved.

Figure 8:
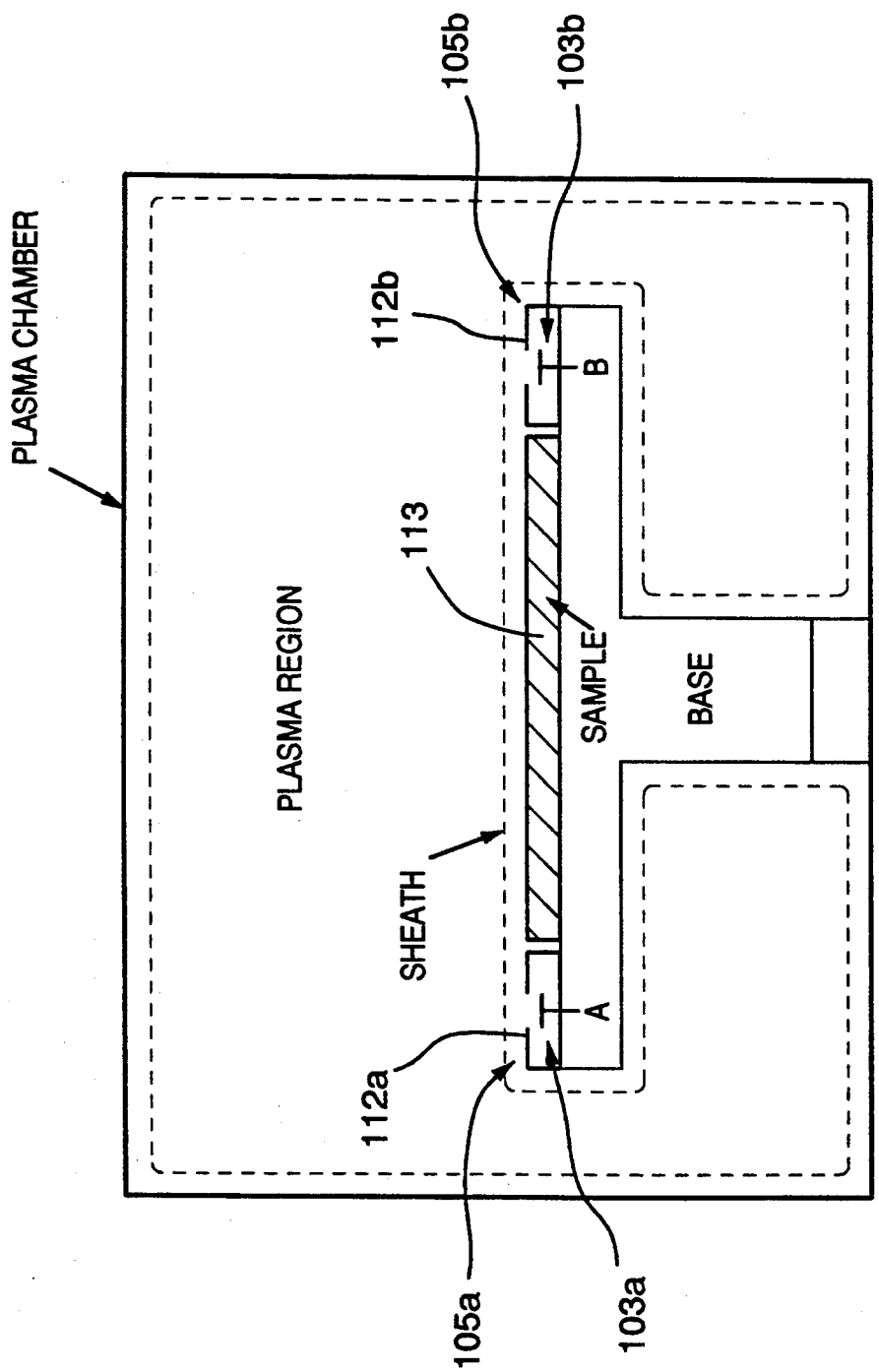

FIG. 8 illustrates an alternative embodiment of the present invention in which a pair of spaced apart flat probes 103a and 103b are positioned in spaced apart aperture assemblies 105a and 105b for positioning of the sample 113 between the assemblies with the sample surface and the aperture wall 112 of the aperture assembly 105 lying in substantially the same plane. The assembly shown in FIG. 8 is especially useful when the sample is not electrically conductive.

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

I claim:

1. The method of maintaining plasma geometry in the plasma chamber in which a plasma with an adjoining wall sheath is established comprising the steps of:
   (a) monitoring the plasma density and plasma temperature in the chamber,
   (b) calculating an initial sample dc voltage V using the measurement in step (a),
   (c) applying the calculated initial sample voltage to a sample or first probe in or adjacent to the chamber,
   (d) then measuring the current to the sample or first probe,
   (e) calculating the new sample voltage for the sample or first probe, (f) applying said calculated new sample voltage to the sample, and
(g) repeating steps (d) through (f).

2. In the method of claim 1 including monitoring the plasma density and plasma temperature with a langmuir probe in the chamber.

3. The method of plasma etching having a sample mounted behind an aperture in the plasma chamber in which a plasma with an adjoining wall sheath is established and maintained comprising the steps of:
(a) monitoring the plasma density and plasma temperature in the chamber,
(b) calculating an initial sample dc voltage V using the measurement of step (a),
(c) applying the calculated initial sample voltage to the sample,
(d) then measuring the current to the sample,
(e) calculating a new sample voltage for the sample,
(f) applying said calculated new sample voltage to the sample, and
(g) repeating steps (d) through (f).

4. The method of claim 3 including monitoring the plasma density and plasma temperature with a langmuir probe in the chamber.

5. The method of plasma etching having a probe in a plasma chamber and a sample mounted behind an aperture in a wall in the plasma chamber in which a plasma with an adjoining wall sheath is established and maintained comprising the steps of:
(a) monitoring the probe to measure the plasma density in and plasma temperature T,
(b) calculating the initial sample dc voltage V from the following equation (1) using the measurement of step (a):

$$ne(KT_e/2\pi m)^{\frac{1}{2}} = 2.336 \times 10^{-6} V^{3/2}(1+0.0247\sqrt{T_p/V})/x^2 \sqrt{m/m_e} \quad (1)$$

wherein e is the change of the electron, $T_e$ is the electron temperature, $T_p$ is plasma temperature and m and $m_e$ are respectively the ion and electron masses and x is the distance between the sample surface and the edge between the plasma and the sheaf,
(c) applying the calculated initial sample voltage to the sample,
(d) then measuring the current i to the sample,
(e) then calculating the current density I from $$I = \frac{b^2}{\text{flat sample area}}$$

wherein b is determined from the relationships (2)

$$\sqrt{i} = S\sqrt{v} + b$$

$$v = V^{3/2}(1+0.0247\sqrt{T/V}) \quad (2)$$

wherein i is the measured sample current and S is a constant of the system measured by varying the voltage on a test sample and measuring the resulting current and plotting the measured current versus the measured voltage,
(f) calculating a new sample voltage with equation (1) with the current density I calculated in step (e) replacing the left hand side of equation (1),
(g) applying said calculated new sample voltage to the sample, and
(h) repeating steps (d) through (g).

6. The method of plasma etching having a sample mounted behind an aperture in a wall of a plasma chamber in which a plasma with an adjoining wall sheath is established and maintained comprising the steps of:
(a) monitoring the sample to measure the plasma density n and plasma temperature T,
(b) calculating the initial sample dc voltage V from the following equation (1a) using the measurement in step (a):

$$ne(KT_e/2\pi m)^{\frac{1}{2}} = 2.336 \times 10^{-6}(-V+U)^{3/2}(1+0.0247\sqrt{T_p/(V+U)})/(d+s)^2\sqrt{m/m_e} \quad (1a)$$

wherein e is the change of the electron, $T_e$ is the electron temperature, U is the plasma potential relative to ground, $T_p$ is plasma temperature, m and $m_e$ are respectively the ion and electron masses and d is the distance between the sample surface and the aperture and s is the distance from the aperture to the edge between the plasma and the sheath,
(c) applying the calculated initial sample voltage to the sample,
(d) then measuring the current i to the sample,
(e) then calculating the current density I from $$I = \frac{b^2}{\text{flat sample area}}$$

wherein b is determined from the following relationships (1)

$$\sqrt{i} = S\sqrt{v} + b$$

$$v = V^{3/2}(1+0.0247\sqrt{T/V}) \text{ and} \quad (2)$$

wherein is the measured sample current and S is a constant of the system measured by varying the voltage on a test sample and measuring the resulting current and plotting the measured current versus the measured voltage,
(f) calculating a new sample voltage with equation (1a) with the current density I calculated in step (e) replacing the left hand side of equation (1a),
(g) applying said calculated new sample voltage to the sample, and
(h) repeating steps (d) through (g).

7. Apparatus for plasma etching in a plasma chamber comprising
an aperture assembly having a wall with an aperture and mounted in the chamber,
means for supporting a sample behind said aperture in said aperture assembly and insulated from said aperture wall, p1 means for measuring the plasma density and plasma temperature in the chamber,
means for applying a dc voltage to the sample, and
means for measuring the current to the sample whereby the plasma density and temperature can be determined by said plasma density and plasma temperature measuring means to calculate an initial voltage which is then applied to the sample for then measuring the sample current by said current to sample measuring means to calculate the current density and a new sample voltage which is then applied to the sample and repeating the steps for calculating and applying a new corrected voltage to the sample.

8. Apparatus of claim 7, including a langmuir probe inside the chamber but outside said aperture assembly for measuring the plasma density and plasma temperature.

9. The apparatus of claim 7 wherein said means for measuring the plasma density and plasma temperature includes a flat probe outside said aperture assembly.

10. The apparatus of claim 7 wherein said means for measuring the plasma density and plasma temperature includes at least a pair of probes outside said aperture assembly and means for applying different voltages to said probes.

11. The apparatus of claim 10 wherein each of said pair of probes have a flat surface behind an associated probe aperture and with said flat surfaces tilted at an angle to the associated probe aperture.

12. Apparatus for monitoring plasma in a plasma chamber comprising a first probe mounted in the chamber, a second flat probe mounted in an aperture assembly in the plasma chamber, said aperture assembly having a wall with an aperture, means for measuring the plasma density and plasma temperature in the chamber, means for applying voltage to the second probe, and means for measuring the current to the second probe whereby the plasma density and temperature can be determined to calculate an initial voltage which is then applied to the second probe for then measuring the probe current to calculate the current density and a new second probe voltage which is then applied to the second probe and repeating the steps for calculating and applying a new corrected voltage to the second probe.

13. The apparatus of claim 12 wherein said first probe is a standard wire langmuir probe.

14. The apparatus of claim 13 wherein said first probe includes a second flat probe positioned in an aperture assembly having a wall with an aperture and mounted in the chamber.

15. The apparatus of claim 14 wherein said first and second flat probes are positioned at different distances from the apertures in the walls adjacent thereto.

16. The apparatus of claim 13 including means for applying different voltages to said first and second probes.

* * * * *